United States Patent
Deng et al.

(10) Patent No.: US 9,172,209 B2
(45) Date of Patent: Oct. 27, 2015

(54) RESISTIVE HEATING ELEMENT FOR ENABLING LASER OPERATION

(75) Inventors: Hongyu Deng, Saratoga, CA (US); Martin Andre Kalberer, Redwood City, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 2131 days.

(21) Appl. No.: 11/670,250

(22) Filed: Feb. 1, 2007

(65) Prior Publication Data

US 2008/0267233 A1    Oct. 30, 2008

(51) Int. Cl.
| | |
|---|---|
| *H01S 3/04* | (2006.01) |
| *H01S 5/024* | (2006.01) |
| *H01S 5/022* | (2006.01) |
| *H01S 5/026* | (2006.01) |
| *H01S 5/12* | (2006.01) |
| *H01S 5/183* | (2006.01) |

(52) U.S. Cl.
CPC ........... *H01S 5/02453* (2013.01); *H01S 5/0261* (2013.01); *H01S 5/02212* (2013.01); *H01S 5/02284* (2013.01); *H01S 5/12* (2013.01); *H01S 5/183* (2013.01)

(58) Field of Classification Search
CPC ... H01S 3/04; H01S 5/02453; H01S 5/02212; H01S 5/02284; H01S 5/0261; H01S 5/12; H01S 5/183

USPC .............................................. 372/34, 36, 50.1
See application file for complete search history.

(56) References Cited

U.S. PATENT DOCUMENTS

| | | | | |
|---|---|---|---|---|
| 5,329,539 A | * | 7/1994 | Pearson et al. .................. 372/36 |
| 5,740,191 A | * | 4/1998 | Kasper et al. .................... 372/34 |
| 5,960,014 A | * | 9/1999 | Li et al. ............................ 372/20 |
| 6,931,215 B1 | * | 8/2005 | Fukuda et al. ................. 398/201 |
| 7,369,587 B2 | * | 5/2008 | Stewart et al. ............. 372/29.02 |
| 7,440,647 B2 | * | 10/2008 | Hosking ......................... 385/14 |
| 2002/0105045 A1 | * | 8/2002 | Kawamura .................... 257/467 |
| 2004/0161248 A1 | * | 8/2004 | Stewart et al. ................. 398/196 |
| 2004/0184494 A1 | * | 9/2004 | Harker et al. .................... 372/36 |
| 2004/0240800 A1 | * | 12/2004 | Uchida ........................... 385/92 |
| 2005/0047460 A1 | * | 3/2005 | Go et al. .......................... 372/43 |
| 2005/0078916 A1 | * | 4/2005 | Hosking ......................... 385/88 |
| 2005/0185684 A1 | * | 8/2005 | Stewart et al. ............. 372/29.02 |
| 2007/0159636 A1 | * | 7/2007 | Jayaraman .................... 356/451 |

* cited by examiner

*Primary Examiner* — Yuanda Zhang
(74) *Attorney, Agent, or Firm* — Maschoff Brennan

(57) ABSTRACT

Heating resistor used to control laser operation. A laser package, such as a Transmitter Optical Subassembly (TOSA) includes a substrate. A laser is disposed on the substrate. A resistive heating element is disposed on the substrate with the laser. Control circuitry is connected to the resistive heating element. The control circuitry is configured to cause current flow through the resistive heating element based on temperature conditions. Current flow through the resistive heating element causes an increase in the operating temperature of the laser. This can be used to increase the effective operating temperature range of a laser.

20 Claims, 1 Drawing Sheet

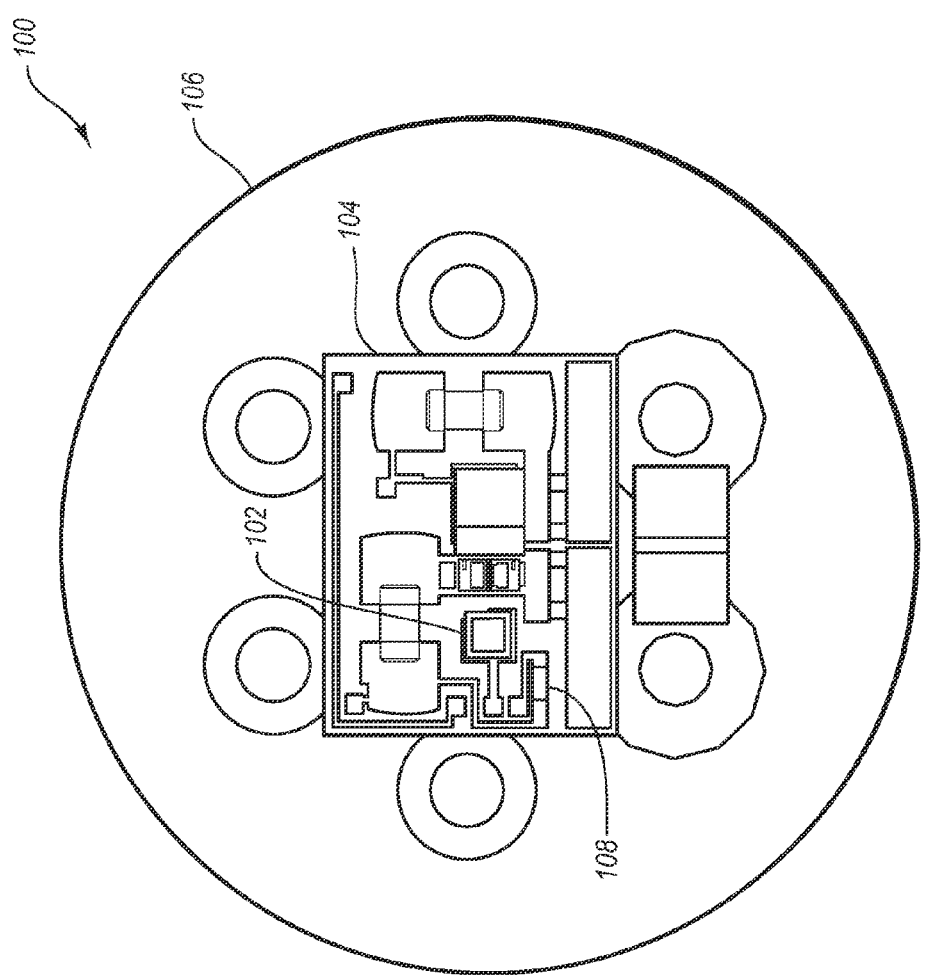

RESISTIVE HEATING ELEMENT FOR ENABLING LASER OPERATION

BACKGROUND OF THE INVENTION

1. The Field of the Invention

The invention is generally directed to optimizing laser operating environments. In particular, the invention is directed to heating a laser to allow the laser to operate in an acceptable temperature range.

2. Description of the Related Art

Lasers are commonly used in many modern components. One use that has recently become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers output a high optical output representing binary highs and a lower power optical output representing binary lows. To obtain quick reaction time, the laser is constantly on, but varies from a high optical output to a lower optical output.

Optical networks have various advantages over other types of networks such as copper wire based networks. For example, many existing copper wire networks operate at near maximum possible data transmission rates and at near maximum possible distances for copper wire technology. On the other hand, many existing optical networks exceed, both in data transmission rate and distance, the maximums that are possible for copper wire networks. That is, optical networks are able to reliably transmit data at higher rates over further distances than is possible with copper wire networks.

Lasers typically have an optimal operating temperature range, which is typically around room temperature. For optimal performance of the laser, the laser temperature needs to be controlled to some range. Operation outside of the temperature range can reduce the laser's performance to the point it is unusable. For example, a decrease in performance of the laser's turn-on time, turn-off time, optical modal properties and optical power may be experienced. For semiconductor lasers such as a VCSELs, DFB lasers, or EMLs, the lasing mode is typically locked by the laser feedback system, which may include, for example, DBR mirrors, or gratings. The gain, i.e. the amplification of the light, is provided by the laser active region. Generally at cold temperatures, the laser active region wavelength shifts to shorter side, also known as a blue shift, due to semiconductor material properties. Therefore at cold temperatures, the gain region peak wavelength may be significantly shorter than the lasing wavelength. This may give rise a host of problems for laser operation.

Illustratively, operation at colder temperatures may cause the laser's reaction speed, the speed at which the laser changes from high power output to low power output, to be decreased, thus lengthening the laser's reaction time and reducing the communication bandwidth. Cold temperatures may also cause a laser intended to operate in a single mode fashion to operate in a multi-mode fashion. Cold operating temperatures may also reduce the amount of power that a laser can output. Despite these limitations at these temperatures, there is increased demand for lasers modules that operate in wider temperature ranges and at colder and hotter temperatures.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF THE INVENTION

In one embodiment, a laser package is disclosed. The laser package includes a substrate. A laser is disposed on the substrate. A resistive heating element is disposed on the substrate with the laser. Control circuitry is connected to the resistive heating element. The control circuitry is configured to cause current flow through the resistive heating element based on temperature conditions. Current flow through the resistive heating element converts electrical energy to thermal energy which increases in the operating temperature of the laser.

In another embodiment, A method of controlling a laser is disclosed. The method includes measuring an ambient temperature. If the ambient temperature is below a pre-determined temperature, a current is adjusted to flow through a resistive heating element disposed on a substrate with the laser.

Still another embodiment disclosed herein controls the voltage across a heating resistor to control heating to optimize operating conditions towards a more optical temperature operating condition.

These and other features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which:

FIG. 1 illustrates an exemplary circuit layout.

DETAILED DESCRIPTION OF THE INVENTION

One embodiment described herein is directed to expanding the range in which a laser assembly, such as a transmitter optical sub-assembly (TOSA) or other laser package, including a laser, may be operated. In particular, one embodiment includes a resistive heating element disposed on the same substrate as the laser in the TOSA. A determination can be made as the ambient temperature of the operating environment for the TOSA. If the ambient temperature is below some pre-determined temperature, current can be passed through the resistive heating element. Heat is transferred to the laser through the substrate to raise the operating temperature of the laser. Current through the resistive heating element can be adjusted depending on the temperature difference between the actual ambient temperature and an ideal ambient temperature.

Modern day computer networks allow for transmissions of large amounts of data between computer terminals. Data may be transmitted on a network across a number of different mediums. As computer technology continues to increase in the amount of data that can be produced in a given time period, cables with high data capacities and long transmission distances may be desirable.

One type of cable that is capable of high data transmission rates over long distances is fiber-optic cable. Fiber-optic cables are plastic or stretched glass cables that carry data signals in the form of light. Light signals can propagate on fiber-optic cables at higher speeds and for longer distances than electronic signals on copper wire based cables. Further, fiber-optic cables are potentially lighter weight and less expensive that their copper based counterparts. Thus, fiber-optic cables are steadily becoming a more popular choice for communication networks.

While fiber-optic data signal are optical or light signals, data signals at computer terminals generally continue to be electronic data signals. Electronic data signals to and from a computer terminal are therefore converted to optical signals. For example, electronic data signals can be converted using an electro-optical transducer, such as a laser diode or light emitting diode (LED) that converts the electronic data signals to corresponding optical data signals. To receive a signal from a fiber-optic network, a computer terminal converts the optical data signal to a corresponding electronic signal using an opto-electronic transducer, such as a photodiode and post-amplifier.

In optical communications, typical systems include TOSAs for transmitting optical signals and receiver optical sub-assemblies (ROSAs) for receiving optical signals. A TOSA typically includes a laser light source which can be used to generate an optical signal that is transmitted from a TOSA onto an optical fiber. The laser is typically connected to a laser driver in the TOSA. The laser driver acts as an interface between a system providing electronic signals and the laser used to generate optical signals.

A ROSA typically includes a photodiode that receives optical signals and converts the optical signals to an electronic signal. A transimpedance amplifier is typically included in the ROSA and is used to amplify the electronic signal created by the photodiode as well as to provide some noise filtering functionality.

Typically, a laser in a TOSA is designed to operate in a specific temperature range. The range is typically limited in width, as temperature changes affect speed, modal properties, and power of the laser. Thus, a laser is typically optimized for a particular range within which the caused variations in speed and power are acceptable. In one embodiment, a 10 Gigabit distributed feedback laser (DFB) laser may be designed to operate in a temperature range of between −10° C. to 90° C. To allow the laser to operate in colder ambient temperatures, a resistive heating element may be included on a substrate with the laser. The resistive heating element is activated in the circuit by running current through the resistive heating element when a TOSA is being operated in an ambient below the range for which the TOSA is optimized.

Referring now to FIG. 1, an exemplary embodiment is illustrated. FIG. 1 illustrates a TOSA 100. The TOSA 100 include includes a laser 102. The laser 102 may be, for example, a distributed feedback (DFB) laser, an electro-absorption modulated laser (EML), a vertical cavity surface emitting laser (VCSEL) or other suitable optical device.

The laser 102 is mounted on a substrate 104. The substrate 104 is usable in creating a submount including the laser 102 and laser driver. The submount can be included in a TO can package illustrated at 106. The substrate 104 may be, for example, a ceramic substrate, silicon nitride substrate, a silicon dioxide substrate, or any other suitable substrate.

FIG. 1 further illustrates a heating resistor 108. The heating resistor 108 may be any suitable resistor. In one embodiment, the heating resistor 108 may be a thin-film resistor printed onto the substrate 104. For example, the thin film resister may be printed on to the substrate during a process for printing other traces and pads onto the substrate 104. In an alternative embodiment, the heating resistor may be a surface mount component. In yet another alternative embodiment, the heating resistor could be monolithically integrated with the laser itself. In one aspect, the resistive heating element comprises at least one of a printed film resistor, a surface mount resistor, or a resistor monolithically integrated with the laser.

Other embodiments may use other suitable components. In one particular embodiment, the heating resistor may be configured to be in the 10 to 100 Ohm range when used with a 3V power source. This provides power dissipation of about 90-900 mW. In particular, it has been noted that in some embodiments, a 1° C. temperature rise can be obtained for every 10 mW of electrical power generated by the heating resistor 108. Thus, using 300 mW, the operating temperature of the laser 102 can be raised 30° C. Thus, in an embodiment where the laser is optimized for −10° C. to 90° C., a TOSA 100 can be implemented that operates from −40° C. to 90° C. by activating the heating resistor 108 when ambient temperatures are below −10° C. Power dissipation of the heating resistor 108 can be controlled such that an appropriate temperature change is achieved.

However, in some embodiments, a somewhat constant current may be provided irrespective of how far a cut-off ambient is below an actual ambient. For example, a device could be designed to operate in a temperature range. The constant current may result in a fixed amount of heat resulting in a fixed temperature rise. The heating resistor is only activated in the circuit when the fixed temperature rise keeps a component in the device, such as a laser, within the temperature limits for the component. The following is an illustrative example. The laser described above is optimized to operate −10° C. to 90° C. A component incorporating the laser may be designed to operate at −40° C. to 90° C. The component may be designed to activate a heating resistor that generates heat sufficient to cause a 30° C. temperature rise when the component is in an ambient temperature below about −10° C. Thus, at an ambient of just below −10° C., the laser will operate at 20° C., a 30° C. rise above the ambient. At an ambient of −40° C., the laser will operate at −10° C., a 30° C. rise above the ambient and still within the optimal range for the laser.

As alluded to previously, some designs may implement a power saving by only providing a sufficient amount of heating to keep the laser at or near the edge of the optimal temperature range. For example, when the exemplary laser above is operated at ambient temperatures below −10° C., a sufficient amount of heat may be generated to raise the laser up to −10° C. or just above −10° C. This can be accomplished in several fashions by controlling the effective current, such as by lowering the amount of current passed through the heating resistor, or by modulating the current using a pulse width modulation scheme regulate the amount of total power dissipated over time. Thus, some embodiments may be optimized to save power, which can be important for some low power applications. Alternatively, a simpler control design can be implemented when saving power is less important.

Various arrangements can be implemented to detect temperatures. For example, in one embodiment, a temperature sensor may be implemented in the TOSA to determine the operating temperature of the TOSA itself. For example, the temperature may be measured in a package such as a TO package in which the TOSA is implemented. In other embodiments, temperature sensing may be accomplished by sensing the temperature of the laser or the substrate on which the laser is disposed. Still other embodiments may implement temperature sensing by sensing the temperature of an ambient temperature external to the TOSA.

While a number of embodiments have been illustrated herein where control circuitry is used to energize a heating element and to control an amount of current through the heating element, other embodiments may use voltage controls across a heating element to control temperature. For example, voltages across a resistor can be raised or lowered based on the value of the resistor and the amount of heating required.

In still other embodiments, heating elements may be used to change the fundamental operating range of a device by being constantly energized or energized with open loop control. For example, embodiments may be implemented where a laser has a given operating range. However, a TOSA in which the laser will be installed will have a different lower temperature operating range. In one embodiment, a resistive heating element may be selected where the resistive heating element is always energized and provides a constant heating of the laser to raise the operating temperature by a predetermined amount. Illustratively, if a laser has an operating temperature of −30° C. to 90° C., a resistive heating element may be included in a laser package that raises the operating temperature of the laser by 10° C. As such, the operating temperature range for the laser package is −40° C. to 80° C.

Additionally, while embodiments have been described with respect to certain temperatures, those temperatures should not be considered limiting in every embodiment. Heating elements may be used in other hotter or colder environments than those described above.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An optical transceiver, the optical transceiver comprising:
   a ROSA, wherein the ROSA is configured to receive an optical signal and convert the optical signal into an electrical signal;
   a transimpedance amplifier, wherein the transimpedance amplifier is configured to amplify the electrical signal produced by the ROSA;
   a TOSA, wherein the TOSA includes is configured to receive an electrical signal and produce an optical signal and wherein the TOSA includes a laser package configured to produce the optical signal;
   an ambient temperature sensor configured to measure an ambient temperature external to the TOSA;
   the laser package comprising:
      a substrate;
      a laser mounted and disposed on a first side of the substrate, wherein the laser includes a lower operating temperature and a upper operating temperature and the laser is configured to operate within certain parameters if the temperature of the laser is between the lower operating temperature and the upper operating temperature;
      a laser driver mounted on the substrate;
      a resistive heating element disposed on the first side of the substrate, wherein the resistive heating element is monolithically integrated with the laser, the resistive heating element providing a 1° C. temperature increase for every 10 mW of electrical power;
      a laser package temperature sensor, wherein the laser package temperature sensor is configured to detect the temperature of the laser package; and
      control circuitry operably coupled to the resistive heating element, wherein the control circuitry is configured to energize the resistive heating element with constant current based on the ambient temperature external to the TOSA, wherein energizing the resistive heating element with constant current causes the temperature of the laser to increase by a predetermined fixed temperature increase; and
   wherein the resistive heating element has two operational states as follows:
      if the ambient temperature external to the TOSA is above the lower operating temperature, the control circuitry does not provide a current to the resistive heating element; and
      if the ambient temperature external to the TOSA is below the lower operating temperature, the control circuitry provides a constant current to the resistive heating element so as to cause the predetermined fixed temperature increase.

2. The laser package of claim 1, wherein the substrate comprises at least one of ceramic, silicon dioxide, silicon nitride, or a printed circuit board.

3. The laser package of claim 1, wherein the resistive heating element comprises a resistance in the range of 1Ω to 1MΩ.

4. The laser package of claim 1, wherein the control circuitry is configured to control a current through the resistive heating element.

5. The laser package of claim 1, wherein the control circuitry is configured to control a voltage across the resistive heating element.

6. The laser package of claim 1, wherein the resistive heating element is a thin-film resistor on the substrate.

7. The laser package of claim 6, wherein the thin-film resistor is printed on the substrate.

8. The optical transceiver of claim 1, wherein the optical transceiver is configured to operate at a temperature lower than the lower operating temperature of the laser package.

9. The optical transceiver of claim 8, wherein the lower operating temperature is −10° C. and the upper operating temperature is 90° C.

10. The optical transceiver of claim 9, wherein the constant current causes the resistive heating element to have 300 mW for a 30° C. predetermined fixed temperature increase.

11. A method of increasing the temperature operating range of a laser, the method comprising:
   providing a TOSA having a laser package and an ambient temperature sensor configured to measure an ambient temperature external to the TOSA, wherein the laser package includes:
      a substrate;
      a laser mounted and disposed on a first side of the substrate, wherein the laser includes a lower operating temperature and a upper operating temperature and the laser is configured to operate within certain parameters if the temperature of the laser is between the lower operating temperature and the upper operating temperature;

a resistive heating element disposed on the first side of the substrate, wherein the resistive heating element is monolithically integrated with the laser, the resistive heating element providing a 1° C. temperature increase for every 10 mW of electrical power;

a laser driver mounted on the substrate;

a laser package temperature sensor configured to detect the laser package temperature; and control circuitry operably coupled to the resistive heating element, wherein the control circuitry is configured to energize the resistive heating element with constant current based on the ambient temperature external to the TOSA, wherein energizing the resistive heating element with constant current causes the temperature of the laser to increase by a predetermined fixed temperature increase;

measuring the ambient temperature external to the TOSA;

measuring a temperature of the laser package with the laser package temperature sensor;

determining whether the ambient temperature external to the TOSA is below the lower operating temperature;

if the ambient temperature external to the TOSA is above the lower operating temperature, the control circuitry does not provide a current to the resistive heating element; and if the ambient temperature external to the TOSA is below the lower operating temperature, energizing the resistive heating element with a constant current to provide the predetermined fixed temperature increase to the laser, wherein the resistive heating element is only activated by the constant current when the predetermined fixed temperature increase results in the laser having a temperature between the lower operating temperature and the upper operating temperature.

12. The method of claim 11, wherein energizing a resistive heating element comprises applying a constant voltage to the resistive heating element.

13. The method of claim 11, wherein the resistive heating element is a thin-film resistor on the substrate.

14. The method of claim 13, wherein the thin-film resistor is printed on the substrate.

15. The method of claim 11, comprising operating the optical transceiver at a temperature lower than the lower operating temperature of the laser package.

16. The method of claim 15, wherein the lower operating temperature is −10° C. and the upper operating temperature is 90° C.

17. The method of claim 16, comprising providing the constant current to the resistive heating element to have 300 mW for a 30° C. predetermined fixed temperature increase.

18. An optical transceiver, the optical transceiver comprising:

a ROSA, wherein the ROSA is configured to receive an optical signal and convert the optical signal into an electrical signal;

a transimpedance amplifier, wherein the transimpedance amplifier is configured to amplify the electrical signal produced by the ROSA;

a TOSA, wherein the TOSA includes is configured to receive an electrical signal and produce an optical signal and wherein the TOSA includes a laser package configured to produce the optical signal;

an ambient temperature sensor configured to measure an ambient temperature external to the TOSA;

the laser package comprising:

a substrate;

a laser mounted and disposed on a first side of the substrate, wherein the laser includes a lower operating temperature and a upper operating temperature and the laser is configured to operate within certain parameters if the temperature of the laser is between the lower operating temperature and the upper operating temperature;

a laser driver mounted on the substrate;

a thin-film resistive heating element printed on the first side of the substrate, wherein the resistive heating element is monolithically integrated with the laser, the resistive heating element providing a 1° C. temperature increase for every 10 mW of electrical power;

a laser package temperature sensor, wherein the laser package temperature sensor is configured to detect the temperature of the laser package; and control circuitry operably coupled to the resistive heating element, wherein the control circuitry is configured to energize the resistive heating element with constant current based on the ambient temperature external to the TOSA, wherein energizing the resistive heating element with constant current causes the temperature of the laser to increase by a predetermined fixed temperature increase; and wherein the resistive heating element has two operational states as follows:

if the ambient temperature external to the TOSA is above the lower operating temperature, the control circuitry does not provide a current to the resistive heating element; and if the ambient temperature external to the TOSA is below the lower operating temperature, the control circuitry provides a constant current to the resistive heating element so as to cause the predetermined fixed temperature increase.

19. The optical transceiver of claim 18, wherein the optical transceiver is configured to operate at a temperature lower than the lower operating temperature of the laser package.

20. The optical transceiver of claim 19, wherein the lower operating temperature is −10° C. and the upper operating temperature is 90° C., and the constant current causes the resistive heating element to have 300 mW for a 30° C. predetermined fixed temperature increase.

* * * * *